United States Patent [19]
Holliday

[11] 3,826,994
[45] July 30, 1974

[54] PHASE LOCK-LOOP FREQUENCY SYNTHESIZER

[76] Inventor: Harley J. Holliday, 83 Saratoga St., Quincy, Mass. 02171

[22] Filed: July 2, 1973

[21] Appl. No.: 375,414

[52] U.S. Cl. .................................... 331/11, 331/17
[51] Int. Cl. ............................................ H03b 3/04
[58] Field of Search ............... 331/10, 11, 12, 2, 17

[56] References Cited

FOREIGN PATENTS OR APPLICATIONS

| | | | |
|---|---|---|---|
| 813,074 | 5/1959 | Great Britain | 331/11 |
| 1,022,766 | 3/1966 | Great Britain | 331/11 |

*Primary Examiner*—John Kominski
*Attorney, Agent, or Firm*—R. S. Sciascia; Charles D. B. Curry

[57] ABSTRACT

A phase lock-loop synthesizer having a coarse voltage adjustment loop, an error loop, and a phase comparison loop. The coarse voltage adjustment loop includes in series a phase lock-loop device, buffer, frequency discriminator, variable gain D.C. amplifier, sum and difference amplifiers. The error loop includes in series the phase lock-loop device, buffer, divide by N circuit, frequency discriminator, sum and difference amplifiers and variable gain D.C. amplifier. The phase comparison loop includes the phase lock-loop device, buffer, divide by N circuit, divide by 2 circuits and a clock. The phase lock-loop frequency synthesizer can select any one of many operating frequencies and automatically maintain the preselected frequency. The coarse adjustment loop functions to generate a control voltage to maintain the desired frequency from the synthesizer. The error voltage loop functions to detect and correct errors between the programmed frequency and the output frequency and to change the output frequency on demand. The phase comparison loop compares the output frequency with the standard frequency.

7 Claims, 3 Drawing Figures

PHASE LOCK-LOOP FREQUENCY SYNTHESIZER

STATEMENT OF GOVERNMENT INTEREST

The invention described herein may be manufactured and used by or for the Government of the United States of America for governmental purposes without the payment of any royalities thereon or therefor.

BACKGROUND OF THE INVENTION

1. Field of the Invention

The present invention relates to a synthesizer and more particularly to a phase lock-loop synthesizer that is capable of selecting any one of many operating frequencies and of automatically maintaining this preselected frequency. 2. Description of the Prior Art In the past, frequency synthesizers were designed using either frequency mixing and filtering or using harmonic generation and filtering. As a result these synthesizers were comparatively complex, large and costly. The present invention overcomes these disadvantages by employing three relatively simple control loops for its operation.

SUMMARY OF THE INVENTION

A phase lock-loop synthesizer having a coarse voltage adjustment loop, an error loop, and a phase comparison loop. The coarse voltage adjustment loop includes in series a phase lock-loop device, buffer, frequency discriminator, variable gain D.C. amplifier, sum and difference amplifiers. The error loop includes in series the phase lock-loop device, buffer, divide by N circuit, frequency discriminator, sum and difference amplifiers and variable gain D.C. amplifier. The phase comparison loop includes the phase lock-loop device, buffer, divide by N circuit, divide by 2 circuits and a clock. The phase lock-loop frequency synthesizer can select any one of many operating frequencies and automatically maintain the preselected frequency. The coarse adjustment loop functions to generate a control voltage to maintain the desired frequency from the synthesizer. The error voltage loop functions to detect and correct errors between the programmed frequency and the output frequency and to change the output frequency on demand. The phase comparison loop compares the output frequency with the standard frequency.

STATEMENT OF THE OBJECTS OF THE INVENTION

An object of the present invention is to provide a synthesizer that is capable of selecting any one of many operating frequencies and automatically maintaining this preselected frequency.

Another object of the present invention is to provide a phase lock-loop frequency synthesizer that is reliable, accurate, relatively simple and inexpensive.

Other objects, advantages and novel features of the present invention will become apparent from the following detailed description of the invention when considered in conjunction with the accompanying drawings wherein:

DESCRIPTION OF THE PREFERRED EMBODIMENTS

Figure 1:
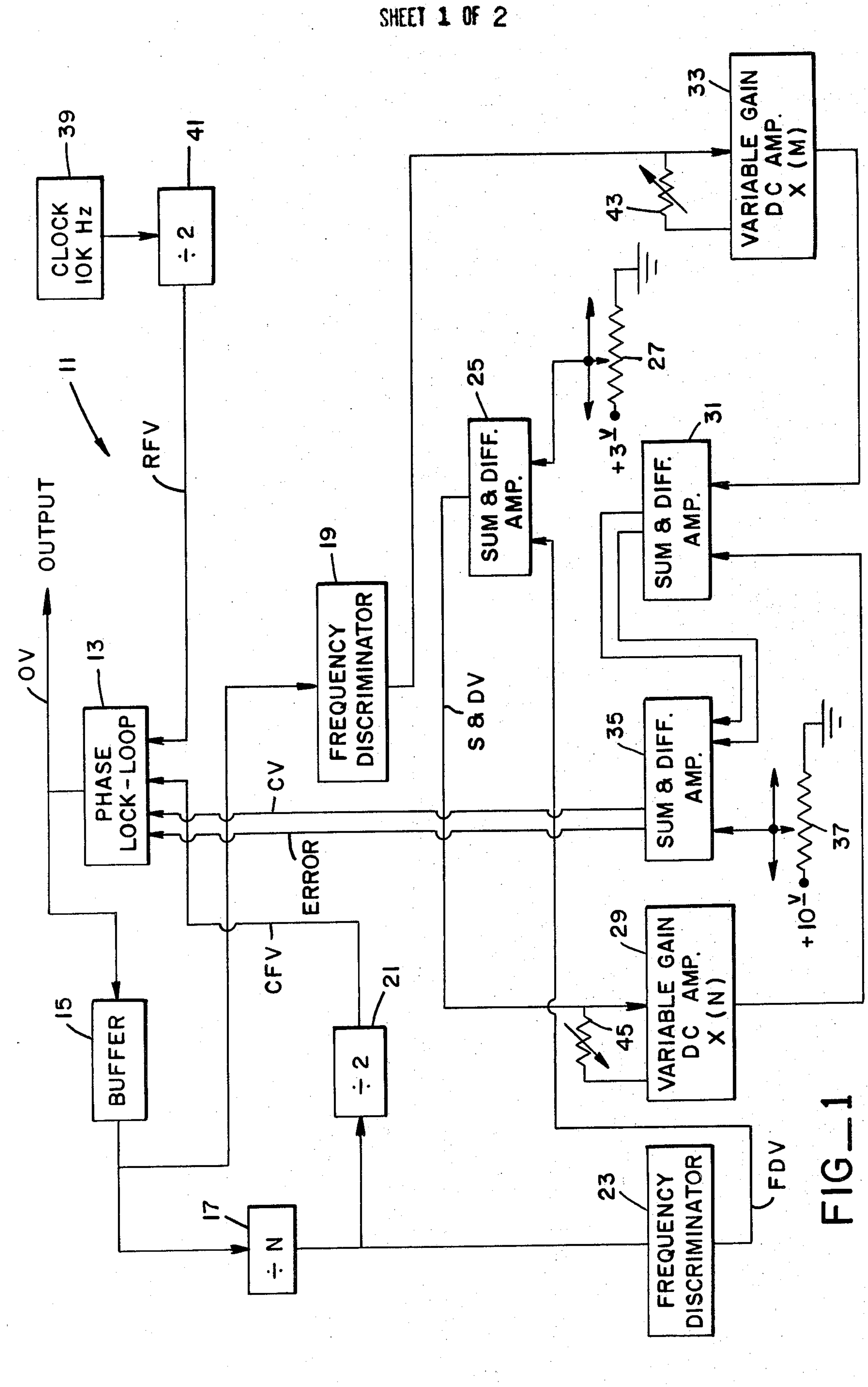
FIG. 1 is a schematic diagram of the phase lock-loop frequency synthesizer of the present invention.

In FIG. 1 is illustrated a schematic diagram of the phase lock-loop frequency synthesizer 11 of the present invention. The synthesizer 11 includes a phase lock-loop device 13 which comprises a voltage control multivibrator coupled with a phase comparator, not shown. One output of the phase lock-loop device 13 is applied to the input of a buffer 15 which is a retriggerable one-shot multivibrator. The purpose of this unit is to buffer the output of the phase lock-loop device from the hereinafter described control circuits. The characteristics of buffer 15 are a 1:1 correspondence between frequency input and frequency output, the output waveform is constant over the entire frequency range and is not affected by the load. One output of the buffer is applied to the input of divide by N circuit 17 and the other output is applied to the input of frequency discriminator 19. The D.C. output of frequency discriminator 19 is directly proportional to the output frequency of buffer 15. The output of frequency discriminator 19 is used in the coarse voltage adjustment loop as hereinafter explained. The output of divide by N circuit 17 is applied to the respective inputs of divide by 2 circuit 21 and frequency discriminator 23. Frequency discriminator 23 has a D.C. voltage output that is directly proportional to the output frequency of divide by N circuit 17. The output of divide by 2 circuit 21, which is the comparing frequency voltage, is applied to one of the inputs of the phase comparator of phase lock-loop device 13. The other input to the phase comparator is the reference frequency voltage from divide by 2 circuit 41. The output of frequency discriminator 23 is applied to one input of sum and difference amplifier 25. The other input to sum and difference amplifier 25 is obtained from variable D.C. voltage source 27. Sum and difference amplifier 25 takes the difference of these two D.C. input signals and provides a D.C. output that is applied to the input of variable gain D.C. amplifier 29. Variable gain D.C. amplifier 29 has a gain factor N where the magnitude of the D.C. output is X(N) where X is the magnitude of its D.C. input voltage and N is the gain. The output of variable gain D.C. amplifier 29 is applied to one input of sum and difference amplifier 31. The output of frequency discriminator 19 is applied to the input of variable gain D.C. amplifier 33, having a gain factor of M where the magnitude of the D.C. output is X(M) where X is the magnitude of the D.C. input voltage and M is the gain. The output of variable gain D.C. amplifier 33 is applied to the other input of sum and difference amplifier 31.

The output of sum and difference amplifier 31 is applied to one input of sum and difference amplifier 35. The other input to sum and difference amplifier 35 is obtained from variable D.C. voltage source 37. Sum and difference amplifier 35 takes the difference of these two D.C. input signals, which is the control voltage. The output of sum and difference amplifier 35, which is the D.C. control voltage, is applied to the phase lock-loop device 13.

A standard clock 39 having a frequency of 10khz, for example, provides an output that is applied to the input of divide by 2 circuit 41 the output of which, which is the reference frequency voltage, is applied to one of the inputs of the phase comparator of phase lock-loop device 13.

There are three primary control circuits used in operation of the phase lock-loop frequency synthesizer 11 of the present invention. These circuits are the (1) coarse voltage adjustment loop, (2) error loop, and (3) phase comparison loop.

The coarse voltage adjustment loop includes in series phase lock-loop device 13, buffer 15, frequency discriminator 19, variable gain D.C. amplifier 33, sum and difference amplifier 31, sum and difference amplifier 35 and back to the phase lock-loop device 13.

The error loop includes in series the phase lock-loop device 13, buffer 15, divide by N circuit 17, frequency discriminator 23, sum and difference amplifier 25, variable gain D.C. amplifier 29, sum and difference amplifier 31, sum and difference amplifier 35 and back to the phase lock-loop device 13.

The phase comparison loop includes phase lock-loop device 13, buffer 15, divide by N circuit 17, divide by 2 circuit 21, and back to phase lock-loop device 13. The phase comparison circuit also includes clock 39 and divide by 2 circuit 41.

The description of operation of the phase lock-loop device 13 will be given first, followed by the coarse voltage adjustment loop, the error voltage loop, the phase comparison circuits and an overall description of operation of the phase lock-loop frequency synthesizer 11.

The phase lock-loop device 13 comprises a voltage-controlled multivibrator (VCO) coupled with a phase comparator. The phase comparator receives the reference frequency voltage (RFV) from divide by 2 circuit 41 and the comparing frequency voltage (CFV) from divide by 2 circuit 21. If the two signals are identical in frequency and phase the output of the phase comparator is such that the output frequency of the VCO is not changed. However, if the two input signals are not the same in frequency and in phase then the output of the phase comparator changes the output of the VCO until the two inputs to the phase comparator are identical in frequency and in phase.

Figure 2:
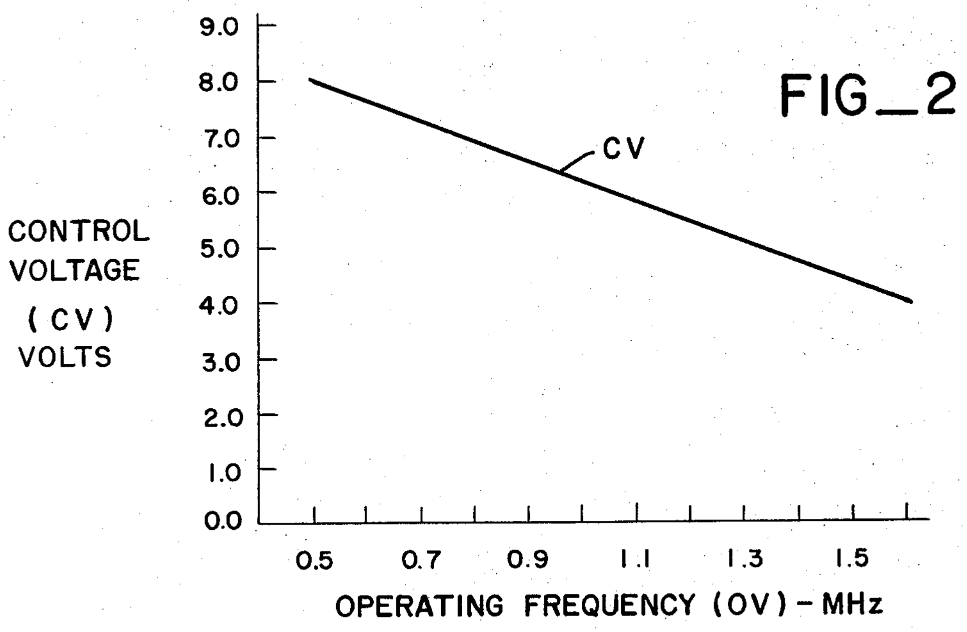
FIG. 2 is a diagram showing the relationship between the control voltage (CV) and the operating frequency voltage (OV)

The purpose of the coarse adjustment loop is to generate a control voltage (CV) required to maintain the desired frequency from the phase lock-loop frequency synthesizer 11. This is achieved by sampling the output of the buffer 15 with the frequency discriminator 19 which generates a D.C. voltage that is proportional to the input frequency. FIG. 2 is a diagram showing the relationship between the control voltage (CV) and the operating frequency voltage (OV). The next steps are to amplify the output of frequency discriminator 19 with variable gain D.C. amplifier 33 and to invert the output of amplifier 33 with sum and difference amplifier 31. The output of sum and difference amplifier 31 is then linearly shifted by adding the desired D.C. voltage from variable D.C. voltage source 37, in sum and difference amplifier 35, until the desired control voltage (CV) shown in FIG. 2 is obtained. Variable D.C. sources 37 and 43 are the two adjustments in this loop. Variable D.C. source 37 adjusts the D.C. level or linear vertical shift of the FIG. 2 curve, whereas variable resistor 43 adjusts the slope of the FIG. 2 curve.

Figure 3:
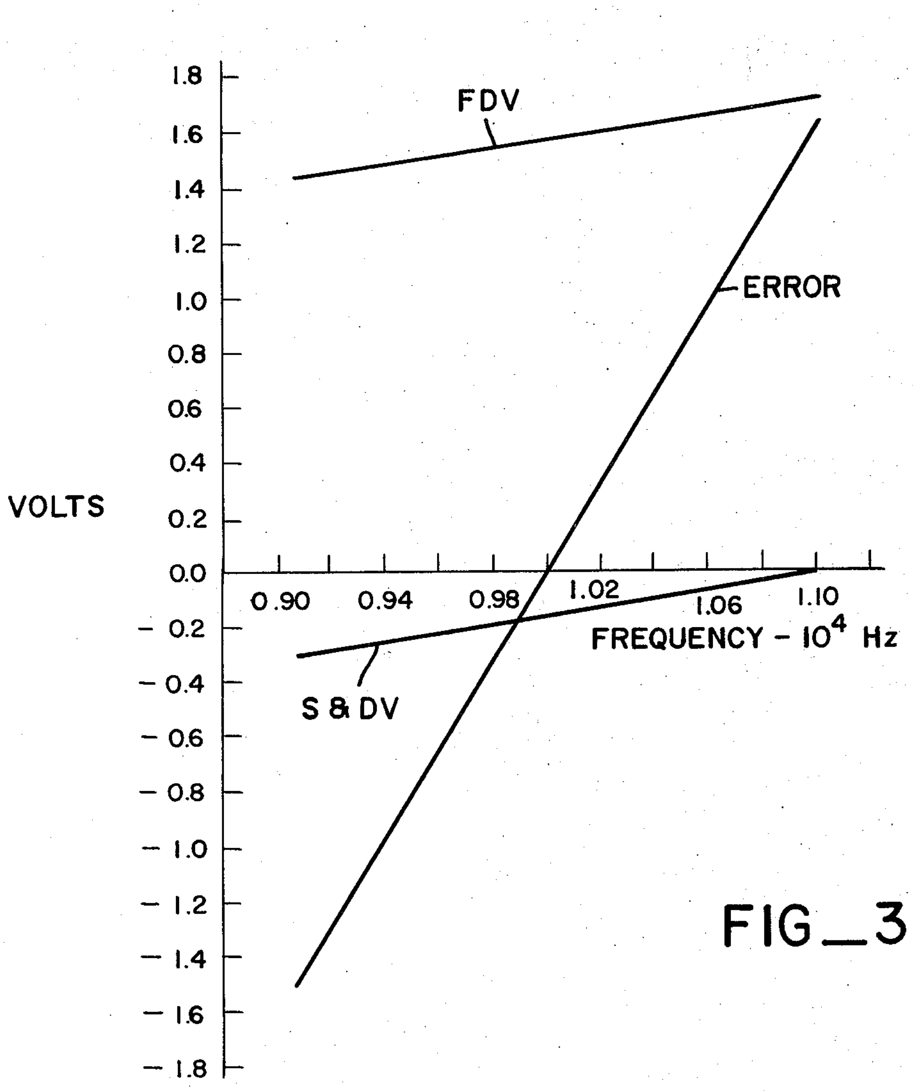
FIG. 3 is a diagram showing the voltage/frequency relationship of the D.C. frequency discriminator output voltage (FDV), the sum and difference amplifier output voltage (S&DV) and the error voltage.

The error voltage loop performs two functions which are (1) to detect and correct errors between the reference frequency voltage (RFV) (the programmed frequency from circuit 41 and clock 39) and the frequency of the output voltage (OV) of the synthesizer 11 and (2) to change the frequency of the output voltage (OV) of the synthesizer 11 on demand. The method used to detect and correct the error is to apply the output of the buffer 15 to the divide by N circuit 17. In divide by N circuit 17 the frequency is divided by some number (N) such that the output of divide by N circuit 17 is 10 khz when the frequency output of synthesizer 11 is exactly the programmed frequency. For example, if the programmed frequency is 1 Mhz, then the number (N) would be $100 = 1 \times 10^2$(i.e., $1 \times 10^6 \div 1 \times 10^2 = 1 \times 10^4$ or 10 khz). Typically the value N may be set by an external control on divide by N circuit 17. The output of divide by N circuit is applied to the input of frequency discriminator 23 to generate D.C. frequency discriminator output voltage (FDV) that is proportional to the input frequency which relationship is shown in FIG. 3. The output of frequency discriminator 23 is applied to one input of sum and difference amplifier 25 and the other input to sum and difference amplifier 25 is from variable D.C. voltage source 27. Sum and difference amplifier 25 takes the difference of these two D.C. input signals. The output of sum and difference amplifier is shown in FIG. 3 and is identified by the legend S&DV. The output of sum and difference amplifier 25 is amplified by variable gain D.C. amplifier 29 by a factor X(N) to adjust the response time of the error voltage loop. The output of variable gain D.C. amplifier 29 is shown in FIG. 3 and is identified by the legend "ERROR." The output of the variable gain D.C. amplifier 29 is added to the coarse voltage in sum and difference amplifier 31. The error voltage is applied to the phase lock-loop device in the same manner as the coarse voltage as previously described as illustrated in FIG. 1 by the two parallel input and output lines for sum and difference amplifier 35.

The operation of the error voltage loop may be readily understood by the following example. Referring to FIG. 2 and the curve labeled ERROR in FIG. 3, assume the following conditions: assume the programmed frequency is 1 Mhz, divide by N circuit 17 is set for N = 100, control voltage (CV) from FIG. 2 = 6.3 volts, output from divide by N circuit 17 is 10 khz. From FIG. 3 the error voltage is zero for 10 khz. Suppose for some reason the output frequency of the synthesizer 11 drifts to say 1.02 Mhz. From FIG. 2 CV would be approximately 6.25 volts. The output from divide by N circuit 17 would be 1.02 khz. From FIG. 3 we have an error voltage of +0.32 volts. The error voltage is applied to the control voltage (CV) driving the output frequency down. As the output frequency goes back to 1.0 Mhz the error voltage goes to zero. The same results are obtained if the frequency output should deviate in the opposite direction.

Suppose it is desired to change the output frequency from 1.0 Mhz to 1.1 Mhz. This is achieved as follows: program synthesizer 11 for 1.1 Mhz by changing divide by N circuit 17 to divide by 110 or N = 110. The output of divide by N circuit 17 would be 1.0 Mhz ÷ 110 = 0.909 khz. From FIG. 3 we find an error voltage of −1.51 volts. This error voltage is added to the control voltage (CV) driving the output frequency up. From FIG. 2 an output frequency of 1.1 Mhz requires a control voltage of 5.9 volts. As the output frequency goes to the new programmed frequency of 1.1 Mhz the error voltage goes to zero (0). The new output frequency of 1.1 Mhz is now set, the error voltage is zero (0) and the proper control voltage (CV) is being generated. It should be noted that the error voltage is always larger than the voltage difference between the required control voltage and the actual control voltage. This is to provide a fast reaction time to correct any errors in the synthesizer output frequency. The reaction time for the error voltage loop is governed by the slope of the curve marked ERROR in FIG. 3. The slope of this curve is adjusted by variable resistor 45 for optimum performance.

The phase comparison loop utilizes buffer 15, divide by N circuit 17, divide by 2 circuit 21 and clock 39 and divide by 2 circuit 41. The output of clock 39 is selected to be 10 khz and divide by 2 circuit 41 divides the frequency by two wherein the input to phase lock-loop device 13 is 5 khz. The output of divide by N circuit 17 is 10 khz when the frequency is exactly as programmed. This output frequency is divided by two by the divide by 2 circuit 21 providing a 5 khz input to phase lock-loop device 13. The 5 khz input derived from synthesizer 11 is compared in phase with the 5 khz from reference clock 39 by the phase comparator within the phase lock-loop device 13. The phase comparator locks the two 5 khz inputs in phase providing the control voltage is the correct value for the programmed frequency as previously discussed.

What is claimed is:

1. A frequency synthesizer comprising:

a. a generator means for generating an output signal having an operating frequency;

b. a clock means for generating a standard signal having a predetermined frequency;

c. a coarse voltage adjustment loop means;

d. an error loop means;

e. a phase comparison loop means;

f. said coarse voltage adjustment loop means being responsive to said output signal and generating a control voltage for maintaining said synthesizer at a predetermined operating frequency;

g. said error loop means responsive to said output signal and said standard signal for generating an error signal;

h. said phase comparison loop responsive to said output signal and said standard signal for generating a signal that is compared with said control voltage for maintaining said synthesizer at said predetermined frequency; and i. said coarse voltage adjustment loop means includes a phase lock-loop device the output of which is connected to the input of a buffer the output of which is connected to the input of a first frequency discriminator, the output of which is connected to the input of a first variable gain D.C. amplifier, the output of which is connected to the input of a first sum and difference amplifier, the output of which is connected to the input of a second sum and difference amplifier, the output of which is connected to the input of said phase lock-loop device.

2. The device of claim 1 wherein:

a. said error loop means includes said phase lock-loop device, the output of which is connected to the input of said buffer, the output of which is connected to the input of a divide by N circuit, the output of which is connected to the input of a second frequency discriminator, the output of which is connected to the input of a third sum and difference amplifier, the output of which is connected to the input of a second variable gain D.C. amplifier, the output of which is connected to the input of said second sum and difference amplifier, the output of which is connected to the input of said phase lock-loop device.

3. The device of claim 2 wherein:

a. said phase comparison loop means includes said phase lock-loop device, the output of which is connected to the input of said buffer, the output of which is connected to said divide by N circuit, the output of which is connected to the input of a first divide by 2 circuit, the output of which is connected to the input of said phase lock-loop device, a clock, the output of which is connected to the input of a second divide by 2 circuit, the output of which is connected to the input of said phase lock-loop device.

4. The device of claim 3 wherein:

a. said first variable gain D.C. amplifier includes a variable D.C. source operably connected to the input thereof.

5. The device of claim 4 wherein:

a. said second variable gain D.C. amplifier includes a variable D.C. source operably connected to the input thereof.

6. The device of claim 5 wherein:

a. said second sum and difference amplifier includes a variable D.C. source operably connected to one of the inputs thereof.

7. The device of claim 6 wherein:

a. said third sum and difference amplifier includes a variable D.C. source operably connected to one of the inputs thereof.

* * * * *